(12) United States Patent
Lee et al.

(10) Patent No.: US 11,205,724 B2
(45) Date of Patent: Dec. 21, 2021

(54) SELF-ALIGNED GATE HARD MASK AND METHOD FORMING SAME

(71) Applicant: Taiwan Semiconductor Manufacturing Company, Ltd., Hsinchu (TW)

(72) Inventors: Kai-Hsuan Lee, Hsinchu (TW); Bo-Yu Lai, Taipei (TW); Sheng-Chen Wang, Hsinchu (TW); Sai-Hooi Yeong, Zhubei (TW); Yen-Ming Chen, Chu-Pei (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 22 days.

(21) Appl. No.: 16/884,805

(22) Filed: May 27, 2020

(65) Prior Publication Data
US 2020/0287042 A1   Sep. 10, 2020

Related U.S. Application Data

(60) Continuation of application No. 16/105,332, filed on Aug. 20, 2018, now Pat. No. 10,686,075, which is a
(Continued)

(51) Int. Cl.
*H01L 23/52* (2006.01)
*H01L 29/78* (2006.01)
(Continued)

(52) U.S. Cl.
CPC ........ *H01L 29/785* (2013.01); *H01L 21/3105* (2013.01); *H01L 21/32* (2013.01); *H01L 21/32115* (2013.01); *H01L 21/823431* (2013.01); *H01L 27/0886* (2013.01); *H01L 29/0847* (2013.01); *H01L 29/4966* (2013.01);
(Continued)

(58) Field of Classification Search
CPC ....... H01L 23/48; H01L 23/52; H01L 23/522; H01L 23/5226; H01L 23/528; H01L 23/5283
See application file for complete search history.

(56) References Cited

U.S. PATENT DOCUMENTS 7,985,643 B2   7/2011   Furukawa et al.
8,772,109 B2   7/2014   Colinge
(Continued)

FOREIGN PATENT DOCUMENTS

CN   1983530 A    6/2007
CN   102347361 A  2/2012
(Continued)

*Primary Examiner* — Jae Lee
(74) *Attorney, Agent, or Firm* — Slater Matsil, LLP

(57) ABSTRACT

A method includes forming a metal gate in a first inter-layer dielectric, performing a treatment on the metal gate and the first inter-layer dielectric, selectively growing a hard mask on the metal gate without growing the hard mask from the first inter-layer dielectric, depositing a second inter-layer dielectric over the hard mask and the first inter-layer dielectric, planarizing the second inter-layer dielectric and the hard mask, and forming a gate contact plug penetrating through the hard mask to electrically couple to the metal gate.

20 Claims, 21 Drawing Sheets

Related U.S. Application Data division of application No. 15/492,167, filed on Apr. 20, 2017, now Pat. No. 10,062,784.

(51) Int. Cl.
  *H01L 29/66* (2006.01)
  *H01L 21/32* (2006.01)
  *H01L 21/3105* (2006.01)
  *H01L 29/08* (2006.01)
  *H01L 21/8234* (2006.01)
  *H01L 27/088* (2006.01)
  *H01L 29/49* (2006.01)
  *H01L 21/321* (2006.01)
  *H01L 21/768* (2006.01)

(52) U.S. Cl.
  CPC ...... *H01L 29/665* (2013.01); *H01L 29/66545* (2013.01); *H01L 21/76834* (2013.01); *H01L 21/76897* (2013.01)

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,412,841 B2 | 8/2016 | Teo et al. | |
| 9,520,482 B1 | 12/2016 | Chang et al. | |
| 9,576,814 B2 | 2/2017 | Wu et al. | |
| 9,607,892 B2 | 3/2017 | Liou et al. | |
| 9,728,455 B2 | 8/2017 | Lu et al. | |
| 9,780,200 B2 | 10/2017 | Zhu | |
| 9,852,947 B1* | 12/2017 | Ko | H01L 21/0337 |
| 2008/0116481 A1 | 5/2008 | Sharma et al. | |
| 2008/0128763 A1 | 6/2008 | Rachmady et al. | |
| 2009/0321795 A1* | 12/2009 | King | H01L 21/28052 257/288 |
| 2009/0321856 A1 | 12/2009 | Rachmady et al. | |
| 2010/0270627 A1* | 10/2010 | Chang | H01L 29/6659 257/411 |
| 2011/0042752 A1 | 2/2011 | Mayuzumi | |
| 2011/0156107 A1* | 6/2011 | Bohr | H01L 29/4966 257/288 |
| 2012/0032238 A1* | 2/2012 | Teo | H01L 29/66545 257/288 |
| 2013/0175619 A1 | 7/2013 | Fan et al. | |
| 2013/0277764 A1 | 10/2013 | Li et al. | |
| 2013/0320411 A1 | 12/2013 | Fan et al. | |
| 2014/0264478 A1 | 9/2014 | Liang et al. | |
| 2015/0255622 A1 | 9/2015 | Ellinger | |
| 2016/0064528 A1* | 3/2016 | Lu | H01L 29/66795 257/288 |
| 2016/0181396 A1* | 6/2016 | Deng | H01L 21/30625 257/346 |
| 2017/0040318 A1 | 2/2017 | Hung et al. | |
| 2017/0103949 A1 | 4/2017 | Teng et al. | |
| 2017/0170067 A1* | 6/2017 | Yeh | H01L 21/30604 |
| 2018/0166560 A1 | 6/2018 | Chiang et al. | |

FOREIGN PATENT DOCUMENTS

| | | |
|---|---|---|
| CN | 104681557 A | 6/2015 |
| KR | 100447989 B1 | 11/2004 |
| KR | 20060038743 A | 5/2006 |
| KR | 20080066815 A | 7/2008 |
| TW | 201624572 A | 7/2016 |
| TW | 201635536 A | 10/2016 |
| TW | 201707070 A | 2/2017 |
| TW | 201714209 A | 4/2017 |

* cited by examiner

SELF-ALIGNED GATE HARD MASK AND METHOD FORMING SAME

PRIORITY CLAIM AND CROSS-REFERENCE

This application is a continuation of U.S. patent application Ser. No. 16/105,332 entitled "Self-Aligned Gate Hard Mask and Method Forming Same," filed Aug. 20, 2018, which application is a divisional of U.S. patent application Ser. No. 15/492,167, entitled "Self-Aligned Gate Hard Mask and Method Forming Same," filed on Apr. 20, 2017, now U.S. Pat. No. 10,062,784, which applications are incorporated herein by reference.

BACKGROUND

In the formation of metal gates and the respective gate contact plugs for Fin Field-Effect Transistors (FinFETs), the metal gates are often recessed, and hard masks are filled into the recesses formed due to the recessing of the metal gates. Some parts of the hard masks are subsequently removed to form contact openings, through which the metal gates are exposed. The gate contact plugs are formed to connect to the metal gates.

The recessing of the hard masks results in the metal gate loss, which requires the metal gates to be formed higher than their final heights in order to compensate for the lost height. The increased height of the metal gates causes difficulty in the gap-filling for forming the metal gates. Also, the recessing of the hard masks suffers from pattern-loading effect in the etching of the hard masks, and the pattern-loading effect causes some portions of the metal gates to be recessed more than other metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-5A, 5B, 6-11, 12A, 12B, 13, 14A, 14B and 15 through 17 are perspective views and cross-sectional views of intermediate stages in the formation of a transistor in accordance with some embodiments.

DETAILED DESCRIPTION

Figure 1:
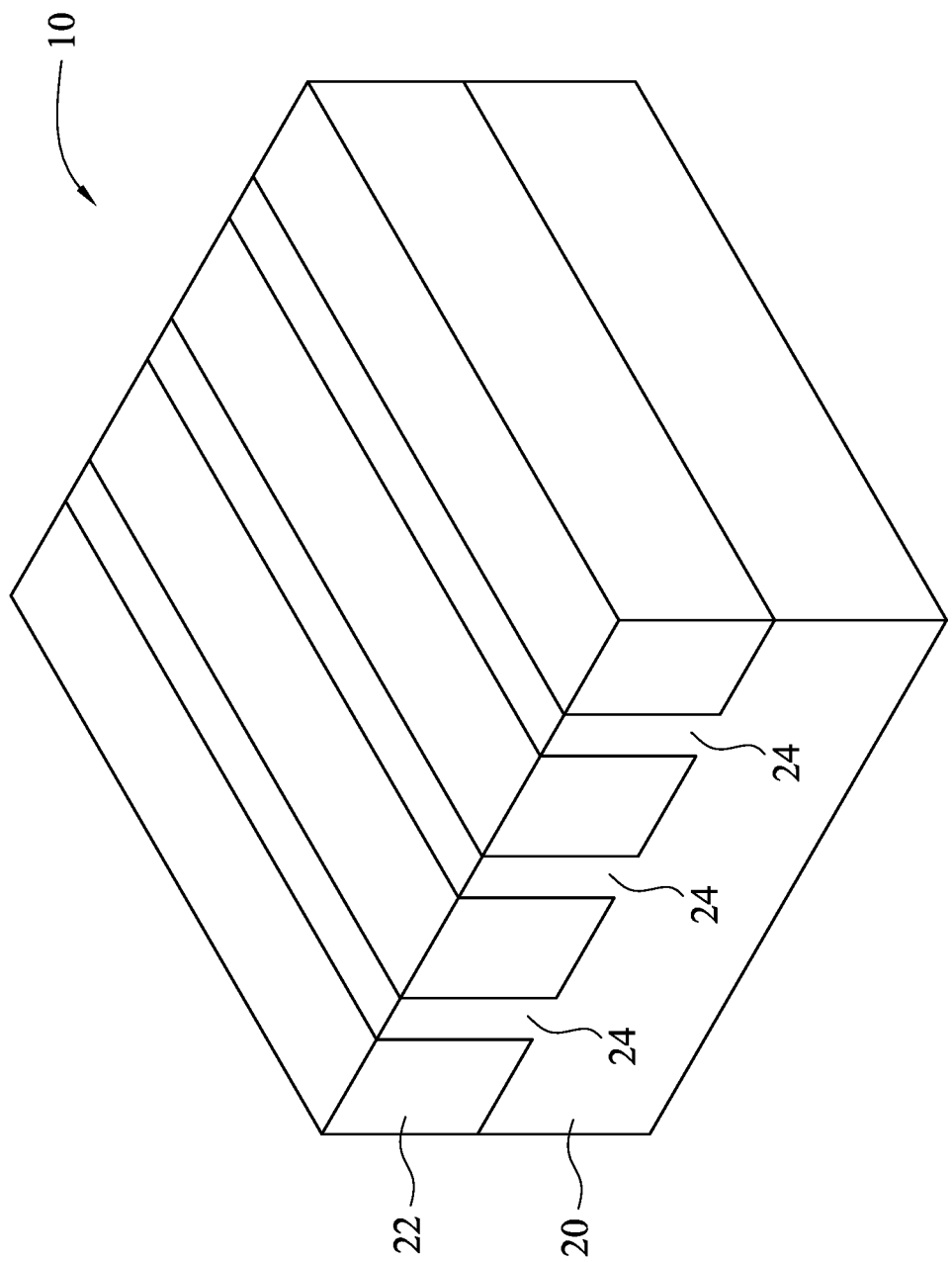

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concept of the present disclosure. Planar transistors may also adopt the concept of the present disclosure.

FIGS. 1 through 17 illustrate the cross-sectional views and perspective views of intermediate stages in the formation of FinFETs in accordance with some embodiments of the present disclosure. The steps shown in FIGS. 1 through 16 are also reflected schematically in the process flow 200 as shown in FIG. 18.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some exemplary embodiments, semiconductor strips 24 are formed of silicon germanium, silicon carbon, or a III-V compound semiconductor material.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
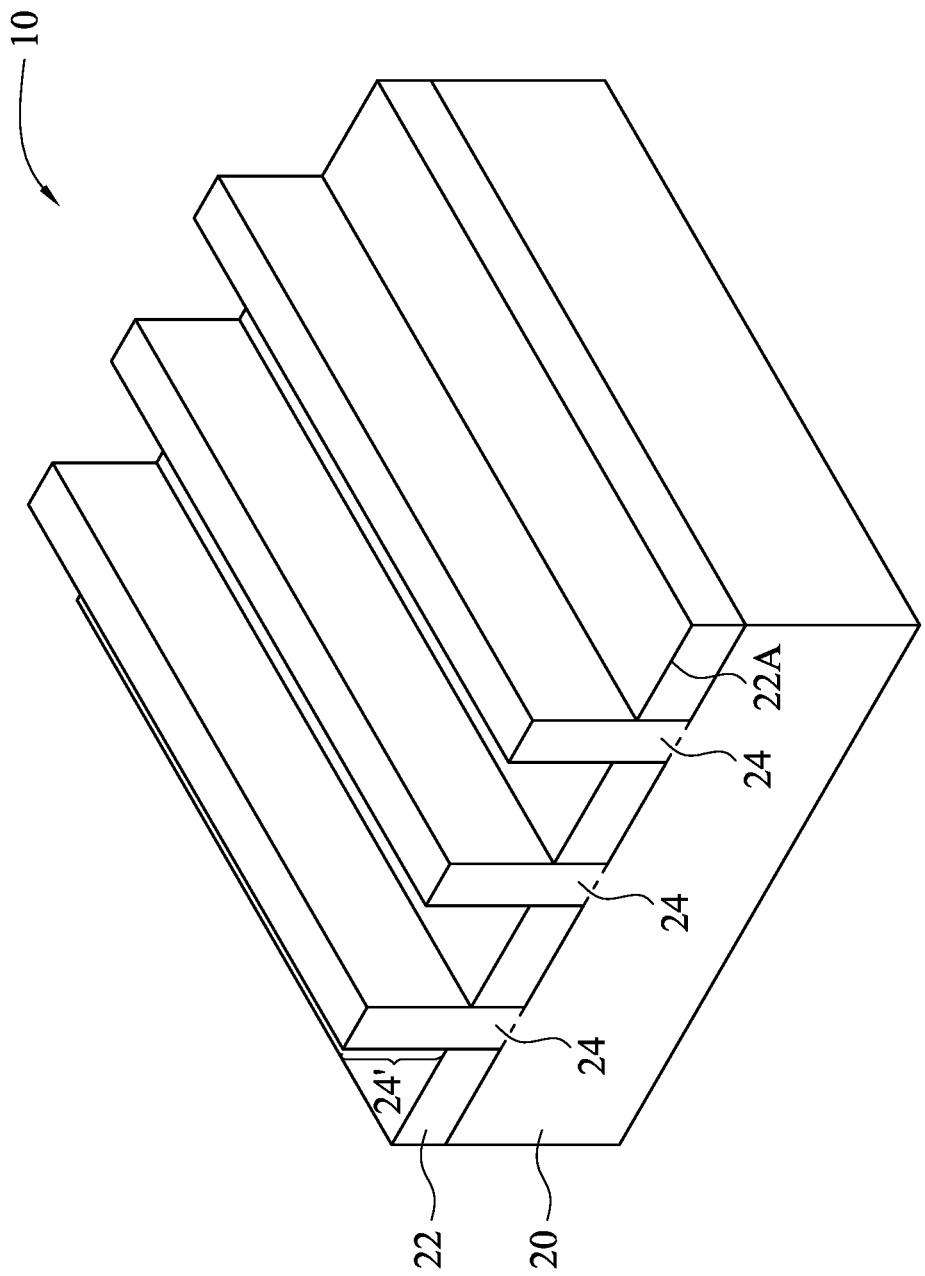

Referring to FIG. 2, STI regions 22 are recessed, so that the top portions of semiconductor strips 24 protrude higher than the top surfaces 22A of the remaining portions of STI regions 22 to form protruding fins 24'. The respective step is illustrated as step 202 in the process flow 200 as shown in FIG. 18. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

Figure 3:
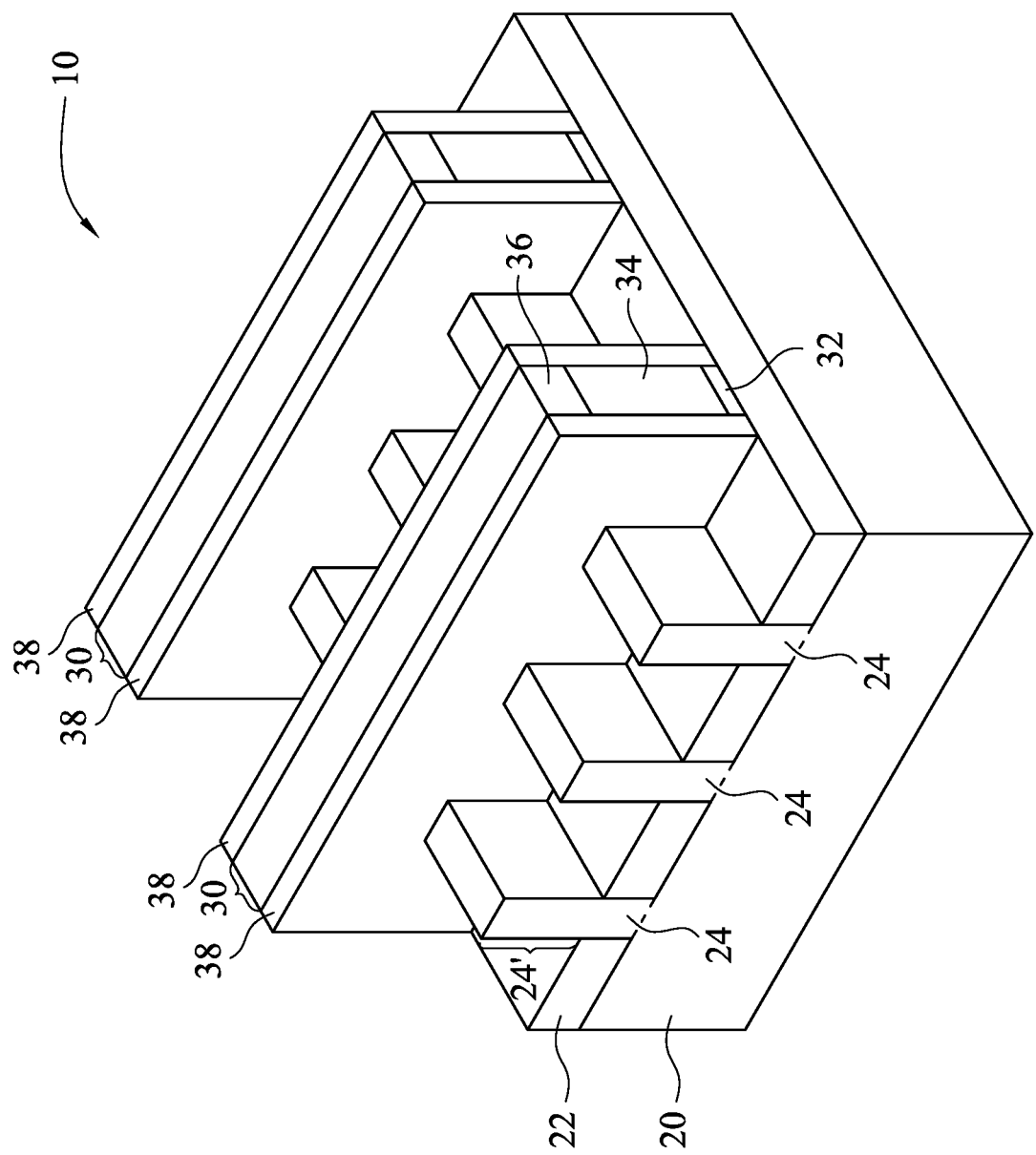

Referring to FIG. 3, dummy gate stack 30 is formed on the top surfaces and the sidewalls of (protruding) fins 24'. The respective step is illustrated as step 204 in the process flow 200 as shown in FIG. 18. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon carbonitride, or the like, and may have a single-layer structure or a multi-layer structure including a plurality of dielectric layers. In accordance with some embodiments of the present disclosure, gate spacers 38 are free from oxygen atoms therein.

Figure 4:
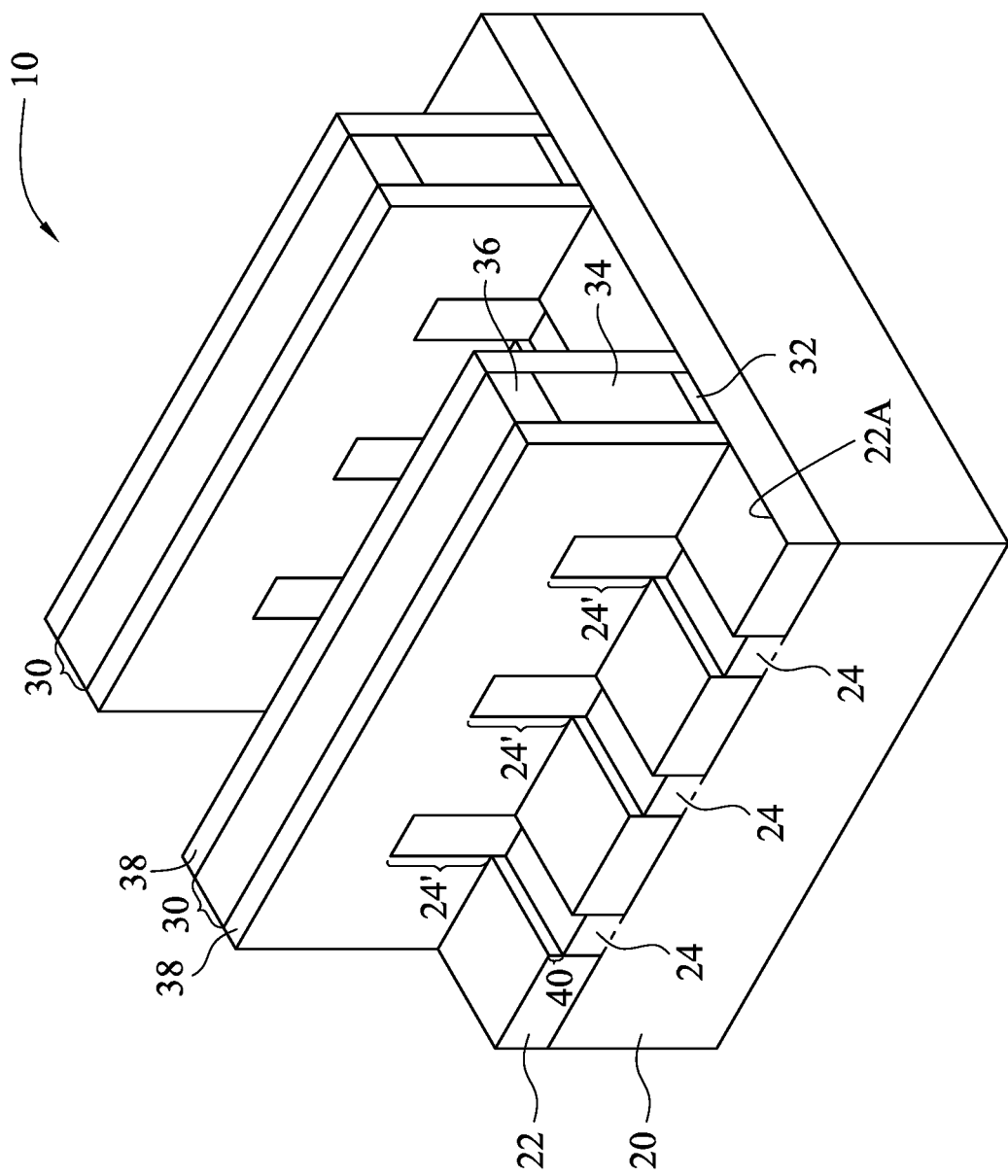

An etching step (referred to as source/drain recessing hereinafter) is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed between STI regions 22. Recesses 40 are located on the opposite sides of dummy gate stacks 30.

Figure 5A:
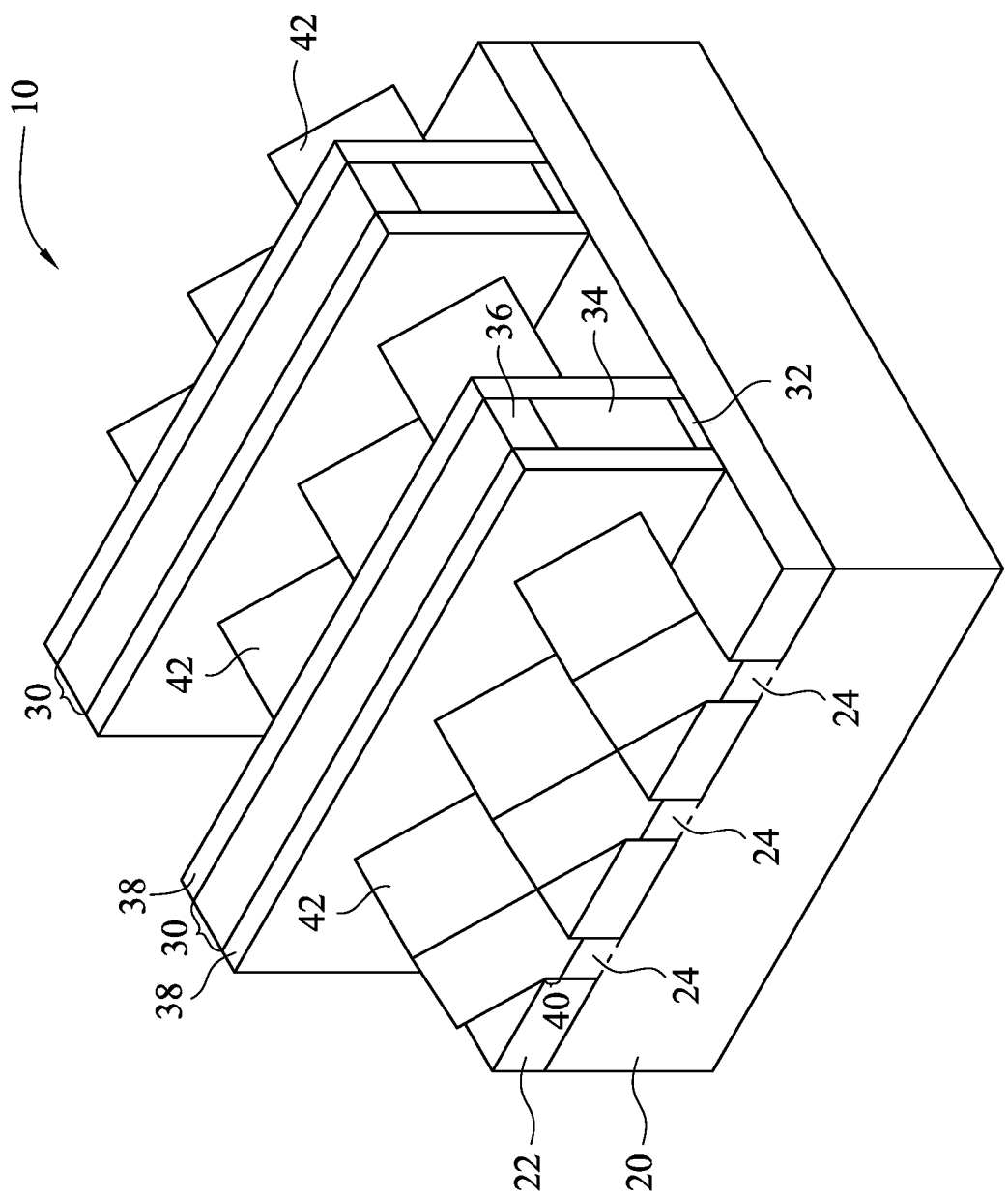

Next, epitaxy regions (source/drain regions) 42 are formed by selectively growing a semiconductor material in recesses 40, resulting in the structure in FIG. 5A. The respective step is illustrated as step 206 in the process flow 200 as shown in FIG. 18. In accordance with some exemplary embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy to form source/drain regions. Epitaxy source/drain regions 42 include lower portions that are formed in STI regions 22, and upper portions that are formed over the top surfaces of STI regions 22.

Figure 5B:
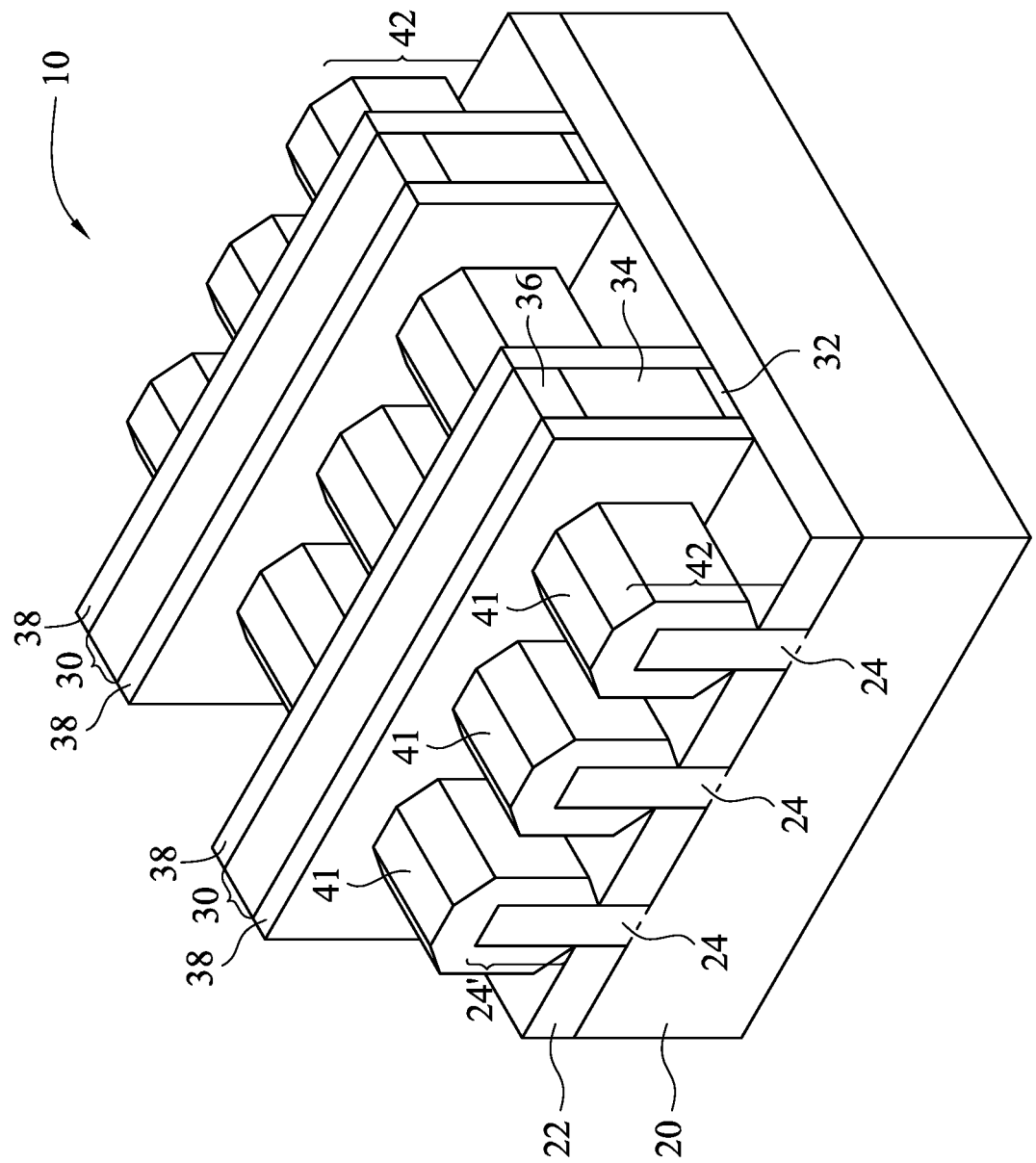

FIG. 5B illustrates the formation of source/drain regions 42 in accordance with alternative embodiments of the present disclosure. In accordance with these embodiments, the protruding fins 24' as shown in FIG. 3 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drains 42 include protruding fins 24' and the epitaxy region 41. An implantation may be performed to implant an n-type impurity or a p-type impurity.

Figure 6:
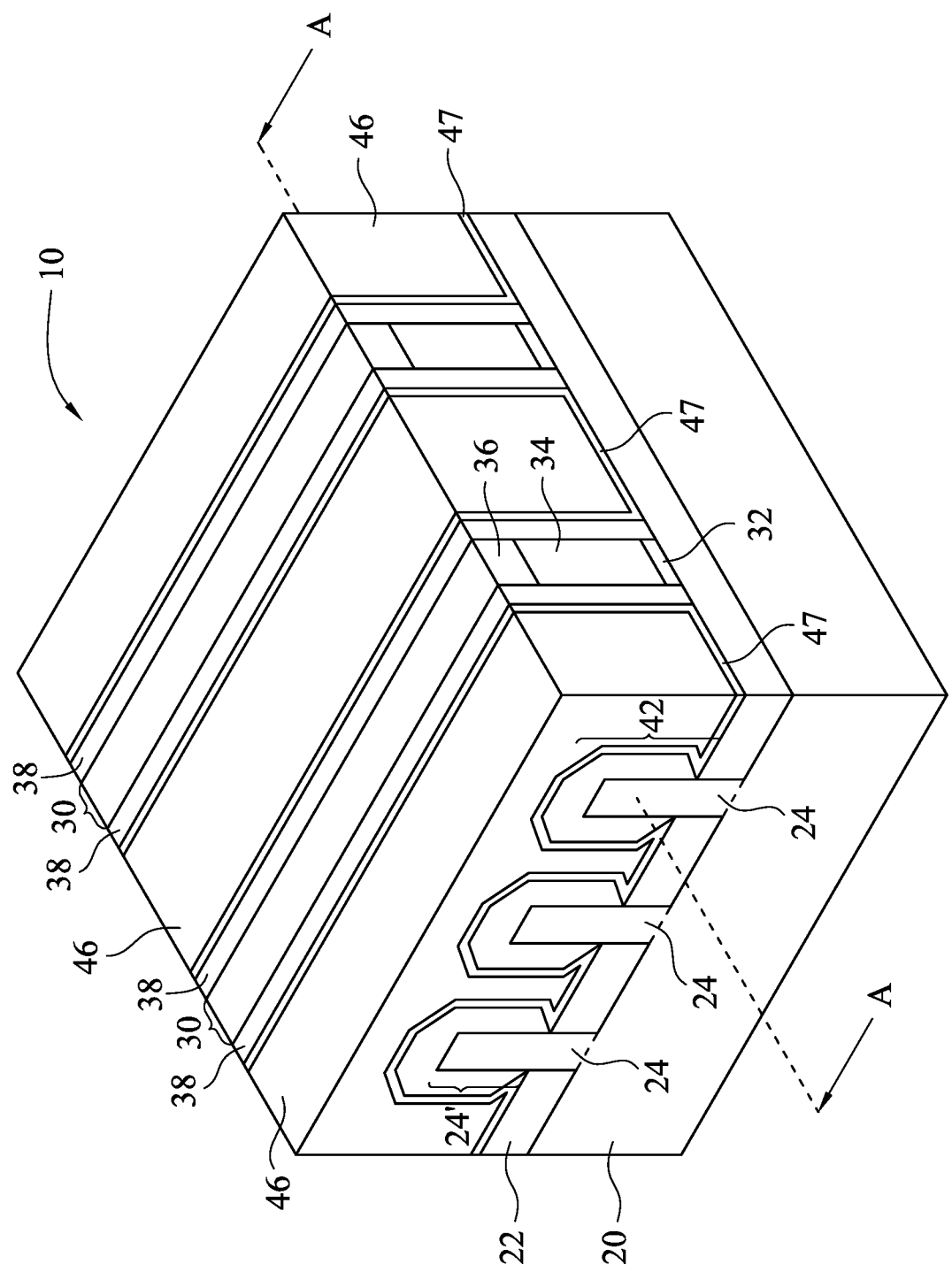

FIG. 6 illustrates a perspective view of the structure after the formation of Contact Etch Stop Layer (CESL) 47 and Inter-Layer Dielectric (ILD) 46. The respective step is illustrated as step 208 in the process flow 200 as shown in FIG. 18. CESL 47 may be omitted in accordance with some embodiments, and when formed, may be formed of silicon nitride, silicon carbo-nitride, or the like. In accordance with some embodiments of the present disclosure, CESL 47 is free from oxygen therein. CESL 47 may be formed using a conformal deposition method such as ALD or CVD, for example. ILD 46 may include a dielectric material formed using, for example, FCVD, spin-on coating, CVD, or another deposition method. ILD 46 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding may be performed to level the top surfaces of ILD 46, dummy gate stacks 30, and gate spacers 38 with each other.

Figure 7:
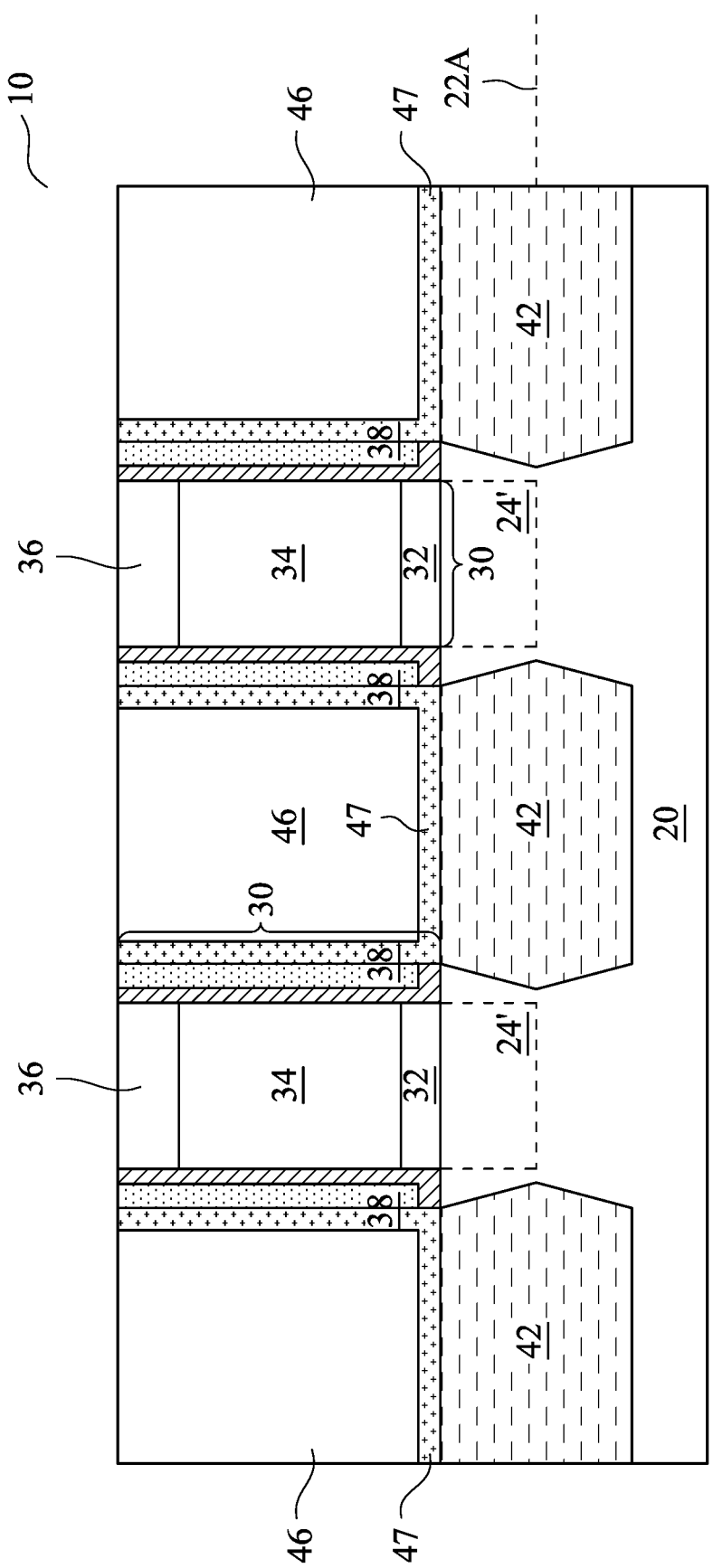

A cross-sectional view of the structure shown in FIG. 6 is illustrated in FIG. 7, wherein the cross-sectional view is obtained from the vertical plane containing line A-A in FIG. 6.

Figure 8:
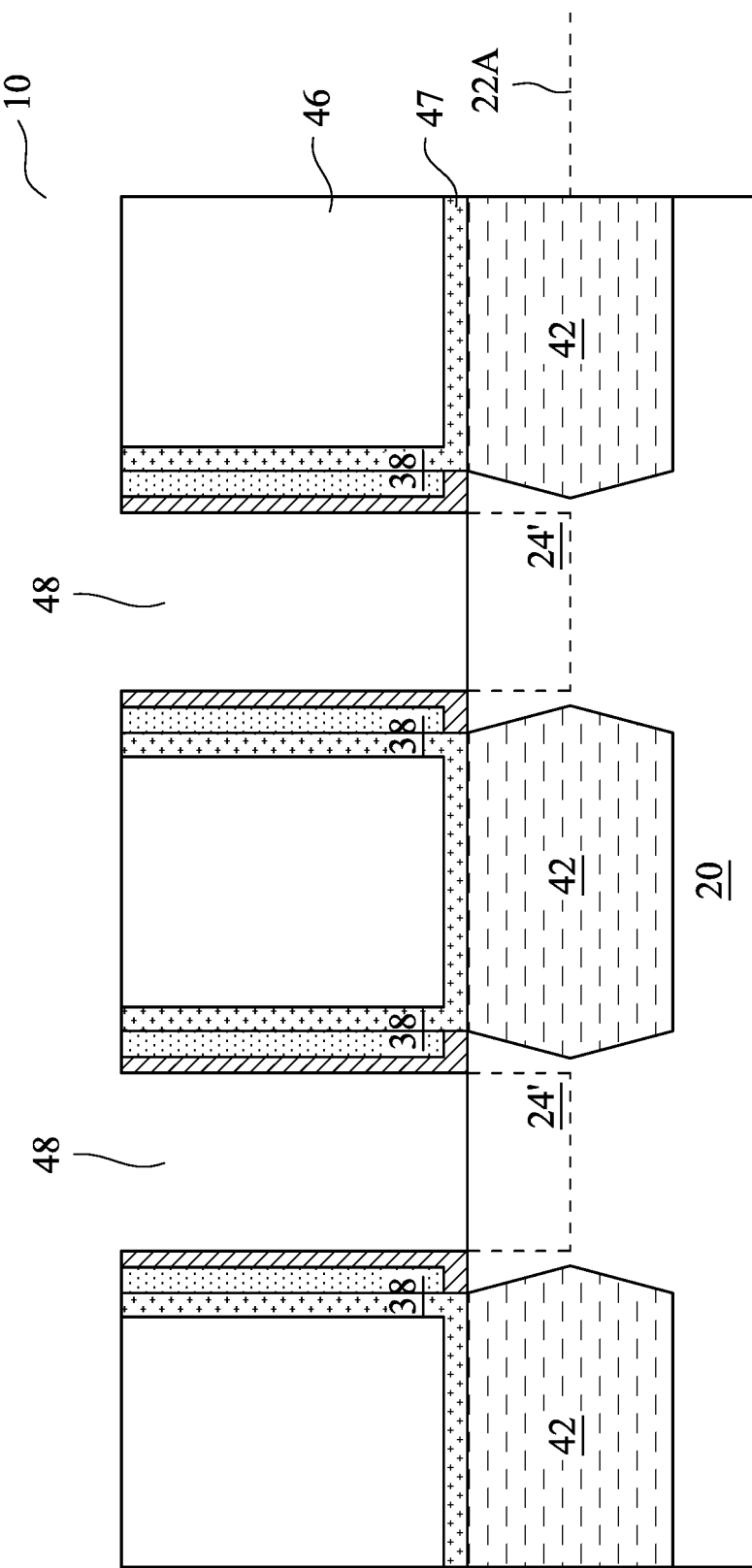
Figure 9:
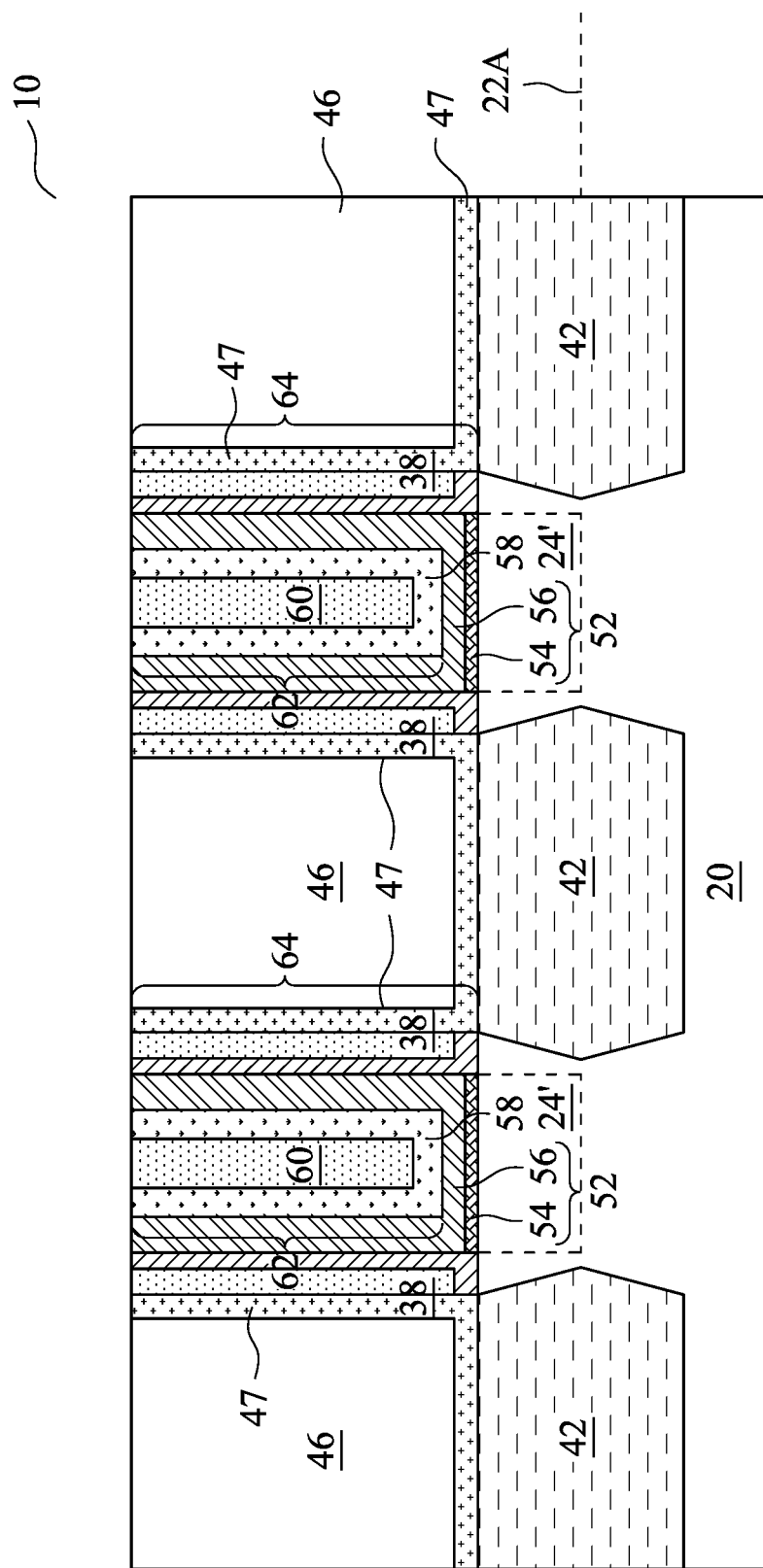

Next, dummy gate stacks 30, which include hard mask layers 36, dummy gate electrodes 34 and dummy gate dielectrics 32, are replaced with replacement gate stacks, which include metal gates and replacement gate dielectrics as shown in FIGS. 8 and 9. The cross-sectional views shown in FIGS. 8 and 9 and the subsequent cross-sectional views are obtained from the same vertical plane containing line A-A in FIG. 6. In the cross-sectional view, the level of the top surfaces 22A of STI regions 22 are illustrated, and semiconductor fins 24' are over top surfaces 22A.

When forming replacing gate stacks, the hard mask layers 36, dummy gate electrodes 34, and dummy gate dielectrics 32 as shown in FIG. 7 are first removed in one or a plurality of etching steps, resulting in trenches/openings 48 as shown in FIG. 8 to be formed. The respective step is illustrated as step 210 in the process flow 200 as shown in FIG. 18. The top surfaces and the sidewalls of protruding semiconductor fins 24' are exposed to trenches 48.

Next, referring to FIG. 9, (replacement) gate dielectric layers 52 are formed, which extend into trenches 48 (FIG. 8). In accordance with some embodiments of the present disclosure, gate dielectric layer 52 includes Interfacial Layer (IL) 54 as its lower part. IL 54 is formed on the exposed surfaces of protruding fins 24'. IL 54 may include an oxide layer such as a silicon oxide layer, which is formed through the thermal oxidation of protruding fins 24', a chemical oxidation process, or a deposition process. Gate dielectric layer 52 may also include high-k dielectric layer 56 formed over IL 54. High-k dielectric layer 56 includes a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. High-k dielectric layer 56 may include oxygen when it is very thin, or may also be oxygen-free. High-k dielectric layer 56 is overlying, and may contact, IL 54. High-k dielectric layer 56 is formed as a conformal layer, and extends on the sidewalls of protruding fins 24' and the sidewalls of gate spacers 38. In accordance with some embodiments of the present disclosure, high-k dielectric layer 56 is formed using ALD or CVD.

Referring further to FIG. 9, stacked layers 58 are deposited. The sub-layers in stacked layers 58 are not shown separately, while in reality, the sub-layers are distinguishable from each other. The deposition may be performed using a conformal deposition method such as ALD or CVD, so that the thickness of the vertical portions and the thickness of the horizontal portions of stacked layers 58 (and each of sub-layers) are substantially equal to each other. The deposited gate dielectric layers 52 and stacked layers 58 extend into trenches 48 (FIG. 8), and include some portions over ILD 46.

Stacked layers 58 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a barrier layer, which may be another TiN layer, is formed.

Next, metallic material 60 is deposited, which may be formed of tungsten or cobalt, for example. Metallic material 60 fully fills remaining trenches 48 (FIG. 8). In a subsequent step as shown in FIG. 9, a planarization step such as CMP or mechanical grinding is performed, so that the portions of layers 56, 58, and 60 over ILD 46 are removed. As a result, metal gate electrodes 62 are formed, which include the remaining portions of layers 58 and 60. The remaining portion of layers 52, 58, and 60 are referred to as replacement gate stacks 64 hereinafter. As shown in FIG. 9, the top surfaces of metal gates 62, gate spacers 38, CESL 47, and ILD 46 may be substantially coplanar at this time.

FIGS. 10 through 12A illustrate the formation of self-aligned hard masks in accordance with some embodiments. The material of ILD 46 is different from that of CESL 47, gate spacers 38, and gate electrodes 62. For example, ILD 46 may be an oxygen-containing dielectric such as an oxide, while CESL 47, gate spacers 38, and gate electrodes 62 are free from oxygen. Accordingly, in FIGS. 10 through 12A, the surfaces of ILD 46, CESL 47, gate spacers 38, and gate electrodes 62 are treated to allow the subsequent selective deposition of the hard masks.

Figure 10:
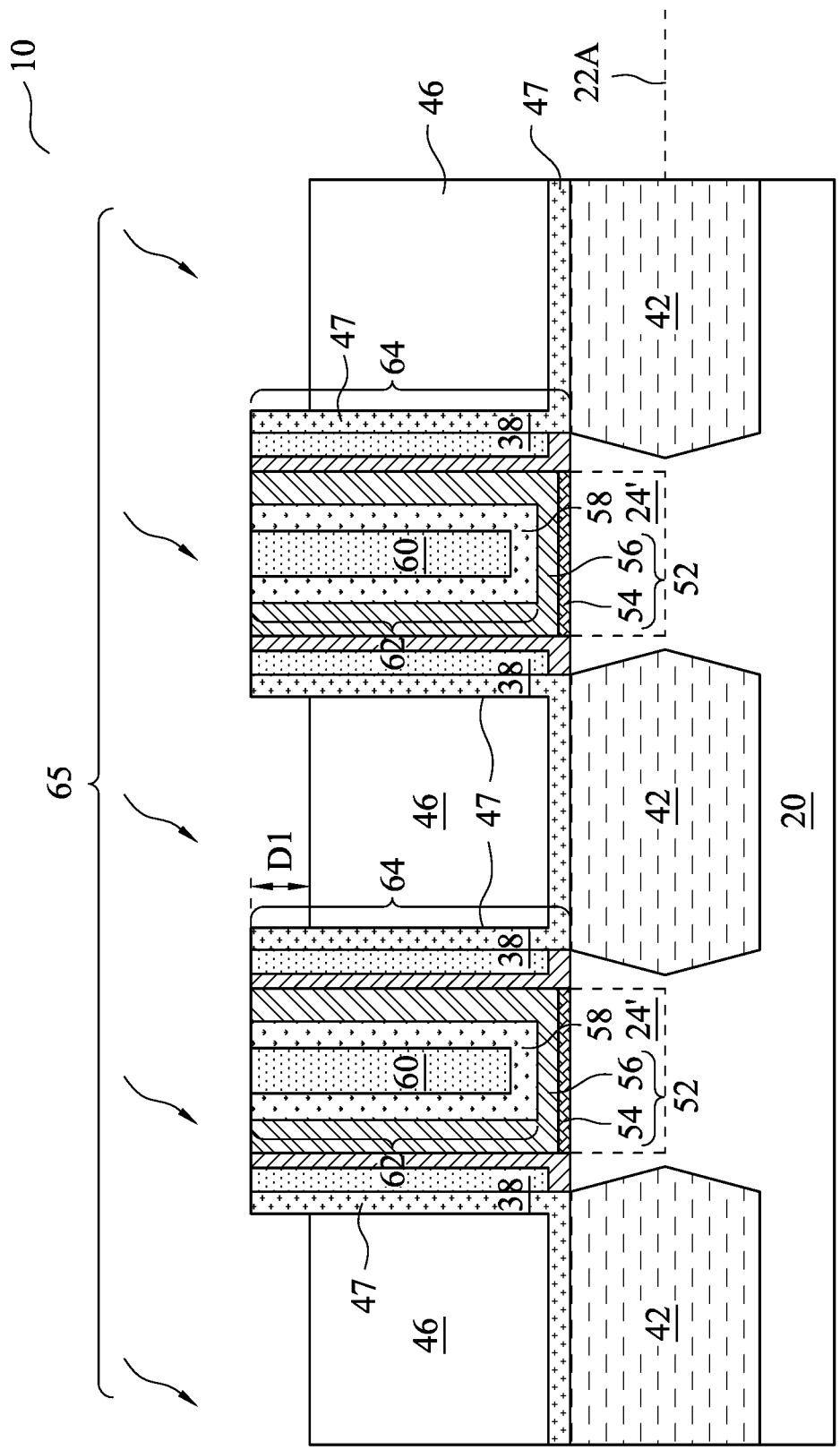

Referring to FIG. 10, a pre-treatment is performed, for example, using an acid, which may be a diluted hydro fluoride (HF) solution. The respective step is illustrated as step 212 in the process flow 200 as shown in FIG. 18. The pre-treatment is schematically represented using arrows 65. The pre-treatment may also be performed using a mixed gas of $NH_3$ (ammonia) and $HF_3$.

In accordance with some embodiments, the pre-treatment has an effect of etching, which causes the recessing of ILD 46. The recessing depth D1 may be in the range between about 10 nm and about 50 nm. Accordingly, the sidewalls of CESL 47 (or the sidewalls of gate spacers 38 if no CESL is formed) are exposed.

Figure 11:
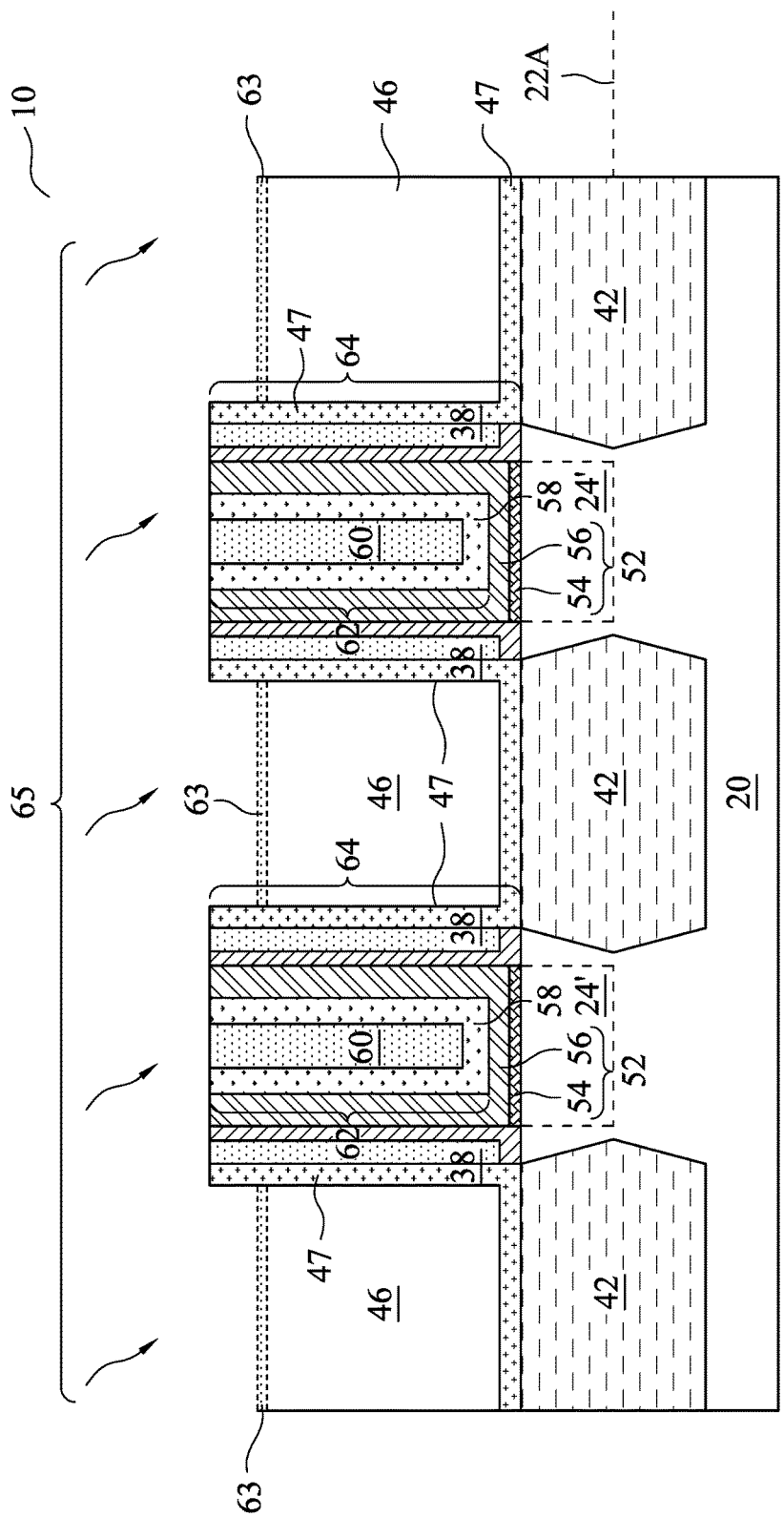

Next, wafer 10 is further treated, and the bonds generated (during the pre-treatment) on the surface of ILD 46 are terminated to generate inhibitor film 63, as shown in FIG. 11. The respective step is illustrated as step 214 in the process flow 200 as shown in FIG. 18. For example, the treatment may be performed to generate some hydro-phobic bonds with the oxygen atoms in ILD 46. The bonds attached to the oxygen atoms may include $Si(CH_3)_3$ in accordance with some embodiments. The respective process for attaching the bonds may include a silylation process, wherein a respective process gas may include Bis(trimethylsilyl)amine, hexamethyldisilazane (HMDS), tetramethyldisilazane (TMDS), trimethylchlorosilane (TMCS), dimethyldichlorosilane (DMDCS), methyltrichlorosilane (MTCS), or the like. In accordance with other embodiments, since the material of ILD 46 is different from that of CESL 47, gate spacers 38, and gate electrodes 62, a thin organic film (also represented as thin film 63) may be selectively deposited on the surface of ILD 46, but not on the exposed surfaces of ILD 46, gate spacers 38, and gate electrodes 62. Accordingly, either through terminating bonds or through selective deposition, the property of the surface of ILD 46 is changed to be different from that of CESL 47, gate spacers 38, and gate electrodes 62.

Figure 12A:
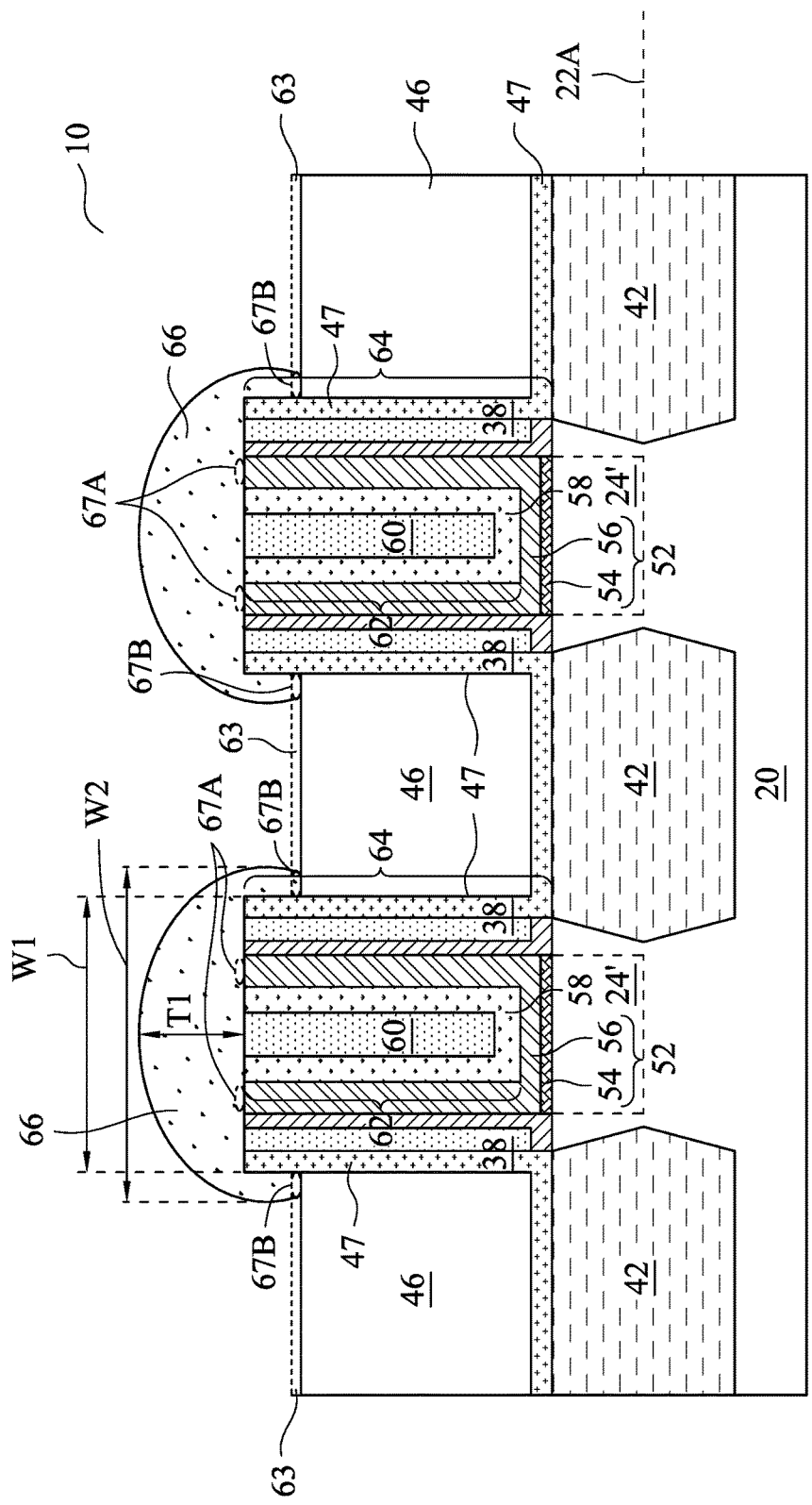

Next, as shown in FIG. 12A, self-aligned hard masks 66 are selectively deposited on the replacement gate stacks 64. The respective step is illustrated as step 216 in the process flow 200 as shown in FIG. 18. Hard masks 66 are referred to as self-aligned hard masks since they are self-aligned to the positions of CESL 47, gate spacers 38, and gate electrodes 62. Hard masks 66 are formed of a dielectric material such as silicon nitride, silicon carbo-nitride, or the like. In the deposition, since the surface of ILD 46 has been changed, it is difficult for nucleation to take place on the surface of ILD 46, and hence hard masks 66 will not be formed starting from ILD 46. On the other hand, hard masks 66 are deposited on the surfaces of CESL 47, gate spacers 38, and gate electrodes 62. The portions of hard masks 66 directly over gate electrodes 62 are mainly grown upwardly, and the portions of hard masks 66 grown from the sidewalls of CESL 47 (or gate spacers 38 if CESL 47 is not formed) are mainly grown horizontally.

In the embodiments in which gate dielectrics 56 contain oxygen, depending on the composition of gate dielectrics 56, hard masks 66 may or may not grow from the top surfaces of gate dielectrics 56. However, since gate dielectrics 56 are thin, and the exposed surfaces of gate dielectrics 56 are narrow, even if hard masks 66 may not be grown starting from gate dielectrics 56 well, the portions of hard masks 66 grown from gate electrodes 62 and gate spacers 38 will merge with each other to form bulk hard masks 66. In accordance with some embodiments, voids (not shown) may (or may not) be formed in regions 67A and/or 67B due to the poor growth in these regions, and the voids may cause hard masks 66 to be physically separated slightly from ILD 46 and/or gate dielectrics 56 in accordance with some exemplary embodiments.

Figure 12B:
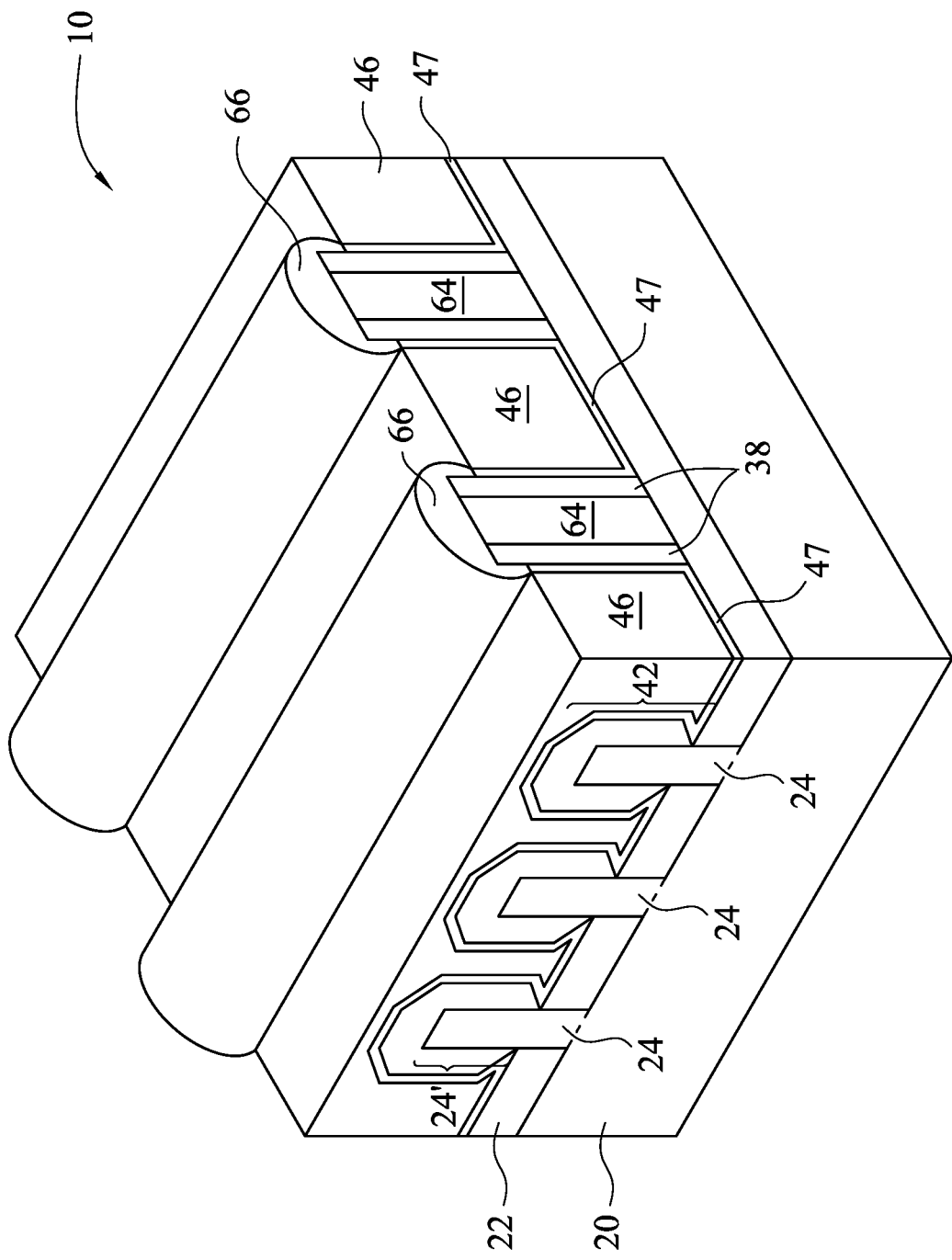

FIG. 12B illustrates a perspective view of wafer 10 as shown in FIG. 12A. FIG. 12B illustrates that hard masks 66 form long strips covering gate electrodes 62, gate spacers 38, and CESL 47. As shown in FIG. 12A, hard masks 66 laterally expand beyond the outer edges of CESL 47, and hence hard masks 66 may have width W2 greater than the distance W1 between the outer edges of the neighboring vertical portions of CESL 47. Hard masks 66 further have rounded (curved) sidewalls and top surfaces. In accordance with some embodiments of the present disclosure, thickness T1 of hard masks 66 is greater than about 10 nm, and thickness T1 may be in the range between about 10 nm and about 100 nm.

After the formation of hard mask 66, a post-treatment is performed to improve the film quality of hard masks 66. In accordance with some exemplary embodiments, the post-treatment is performed through a Rapid Thermal Anneal (RTA) at a temperature between about 800° C. and about 1,200° C. In accordance with alternative embodiments, the post-treatment is performed through plasma treatment, with the process gas including $N_2$, $H_2$, Ar, He, and/or the like, for example. The post-treatment removes the dangling bonds of hard masks 66, making them less porous and more resistant to subsequent cleaning processes.

Depending on the method of the post-treatment and the composition of inhibitor film 63, the post-treatment may or may not result in the removal of inhibitor film 63. If inhibitor film 63 is not removed as result of the post-treatment, after the formation of hard masks 66, and before or after the post-treatment, an additional process is performed to remove inhibitor film 63 to enable the deposition of overlying ILD. In accordance with some embodiments, inhibitor film 63 is removed in an etching gas or an etching solution, depending on the type of inhibitor film. In accordance with alternative embodiments, inhibitor film 63 is removed using plasma, which may have slight bombarding effect.

Figure 13:
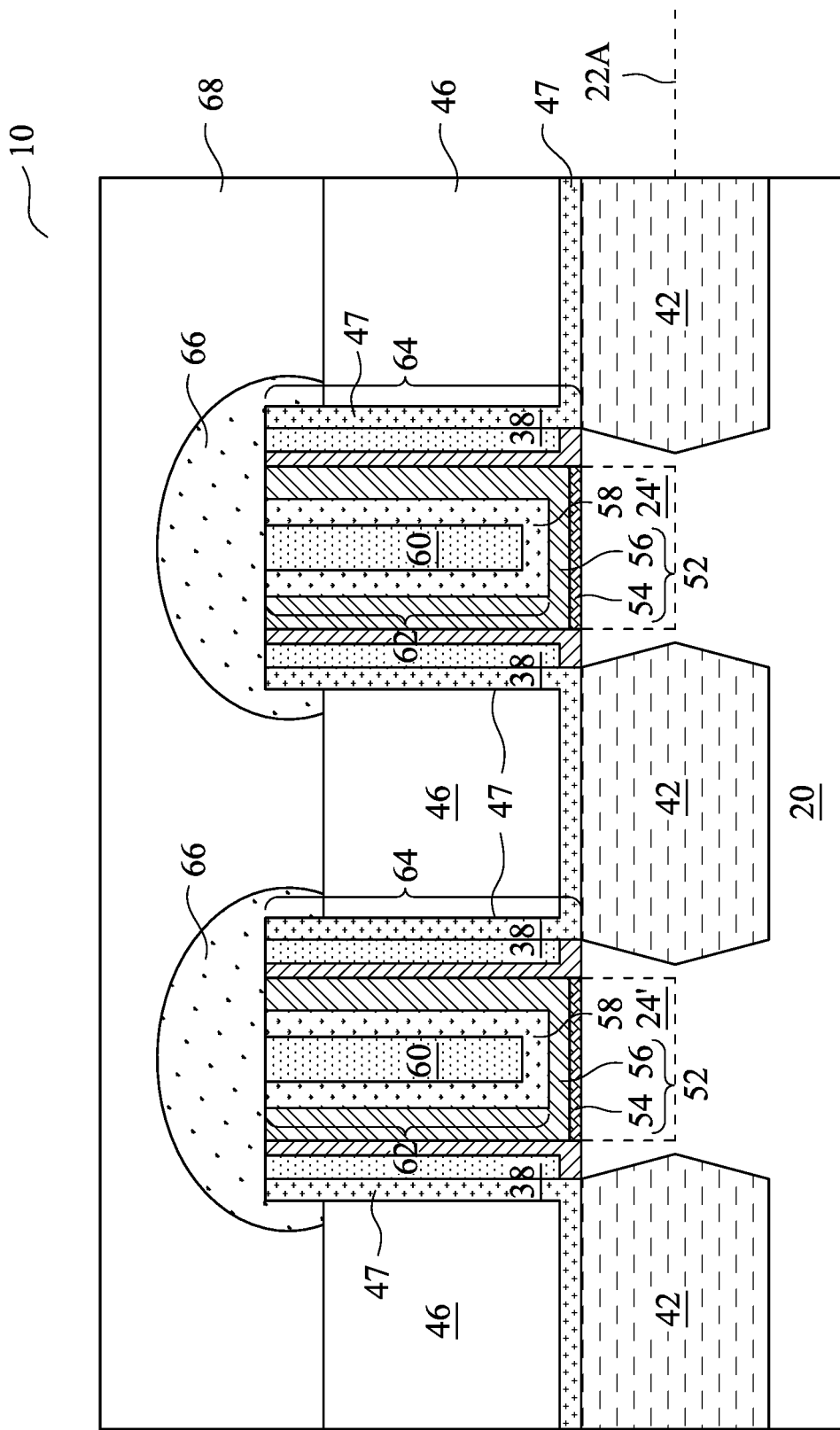

Next, as shown in FIG. 13, ILD 68 is formed. The respective step is illustrated as step 218 in the process flow 200 as shown in FIG. 18. ILD 68 may be formed using a material selected from the same group of candidate materials as ILD 46, and the material of ILD 68 may be the same or different from the material of ILD 46. ILD 68 has a top surface higher than the top surfaces of hard masks 66, so that hard masks 66 are embedded in ILD 68. There may be, or may not be, a visible interface between ILD 46 and ILD 68.

Figure 14A:
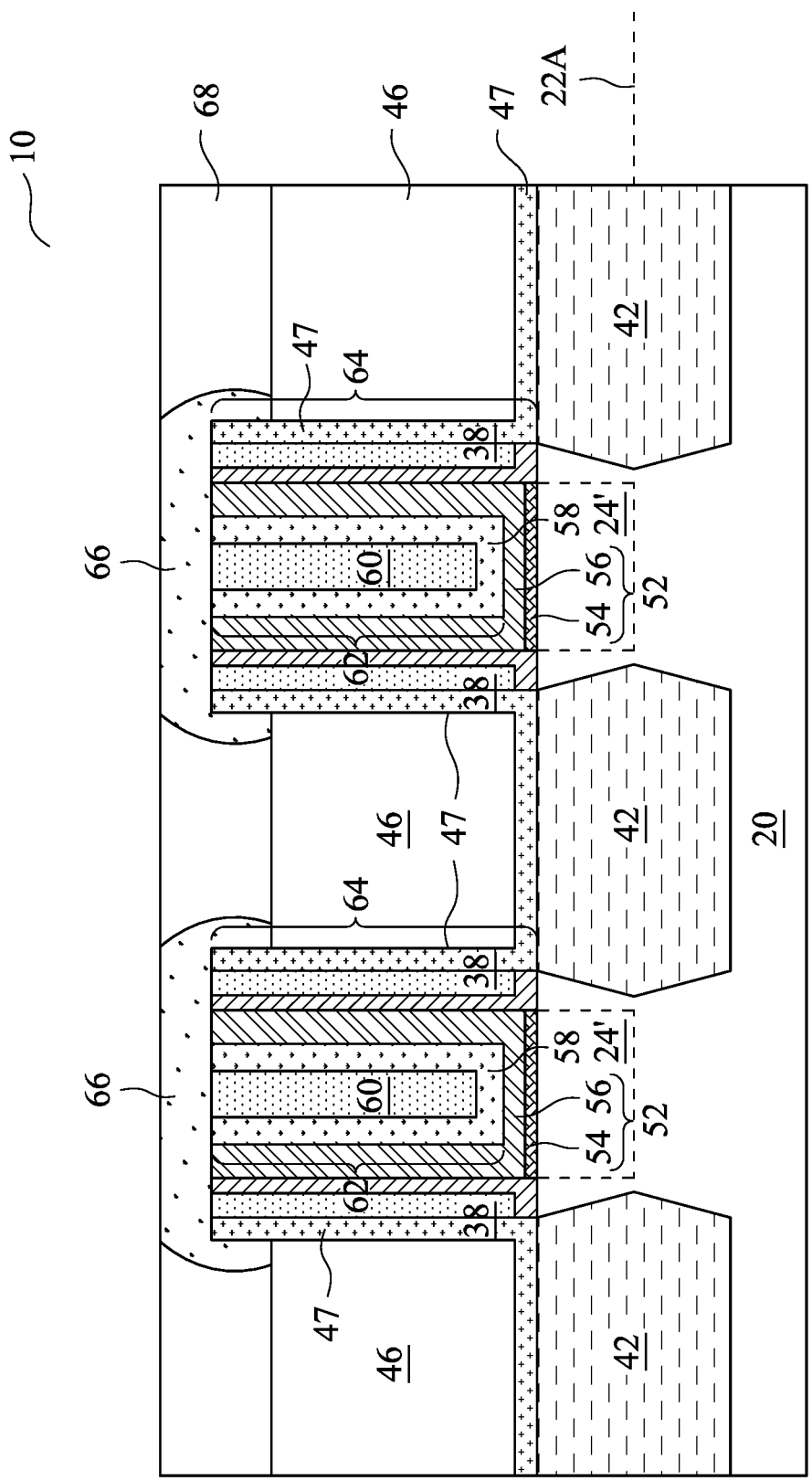
Figure 14B:
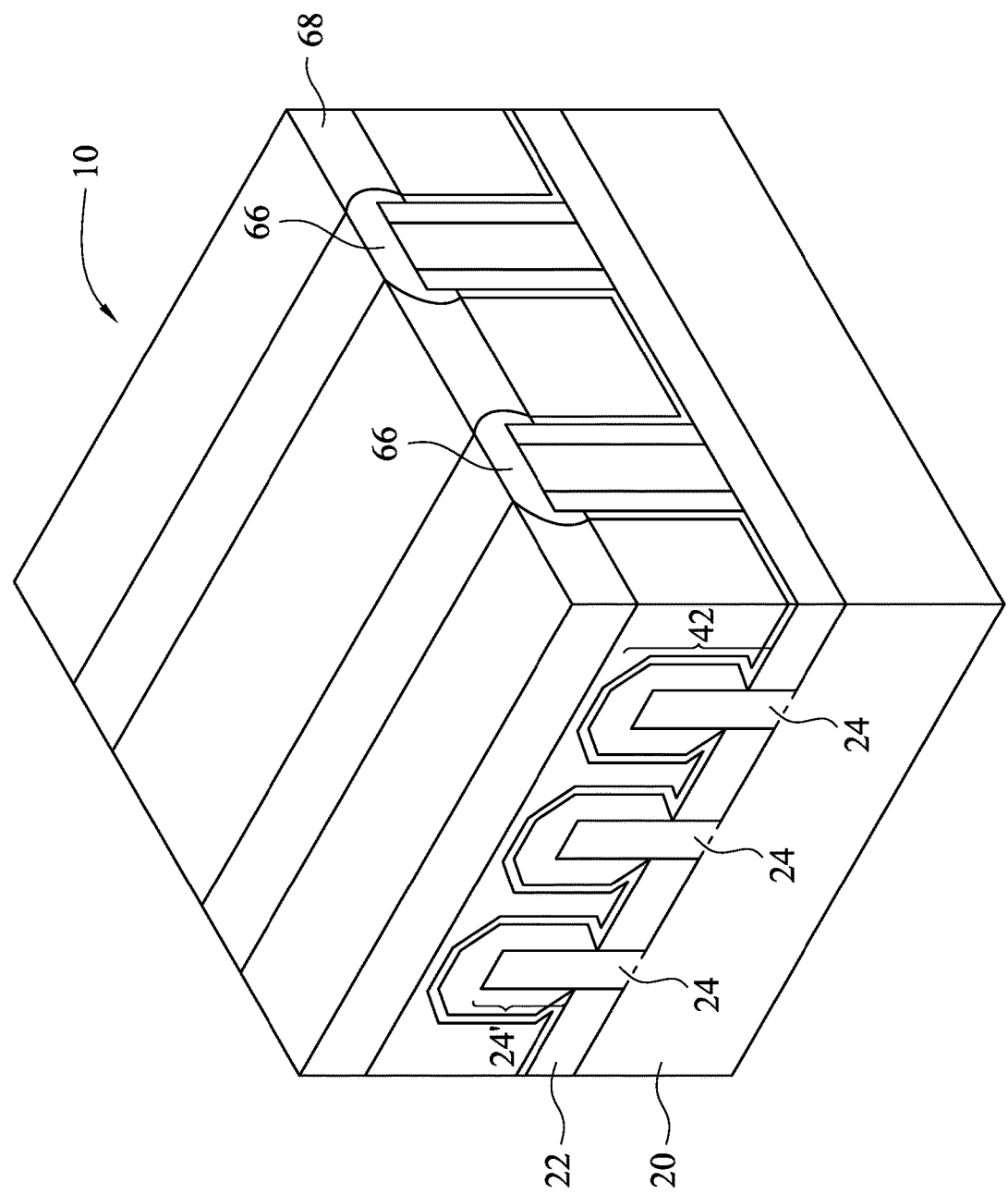

FIGS. 14A and 14B illustrate a cross-sectional view and a perspective view, respectively, of wafer 10 after a planarization step, which may be performed using CMP or mechanical grinding. FIG. 14B illustrates a perspective view of the wafer 10 as shown in FIG. 14A. The respective step is illustrated as step 220 in the process flow 200 as shown in FIG. 18. As a result of the planarization step, the top surfaces of hard masks 66 are planarized, and are coplanar with the top surface of ILD 68. The remaining hard masks 66 still have curved sidewalls in contact with ILD 68.

After the planarization, an additional post-treatment may be performed to further improve the film quality of hard masks 66. The additional post-treatment has the similar function as the previous post-treatment performed before ILD 68 is formed, and may remove the newly exposed dangling bonds of hard masks 66 exposed as a result of the planarization, and further makes hard masks 66 less porous and more resistant to subsequent cleaning processes. The additional post-treatment may be performed using a method selected from the same group of candidate materials and methods for performing the previous treatment.

Figure 15:
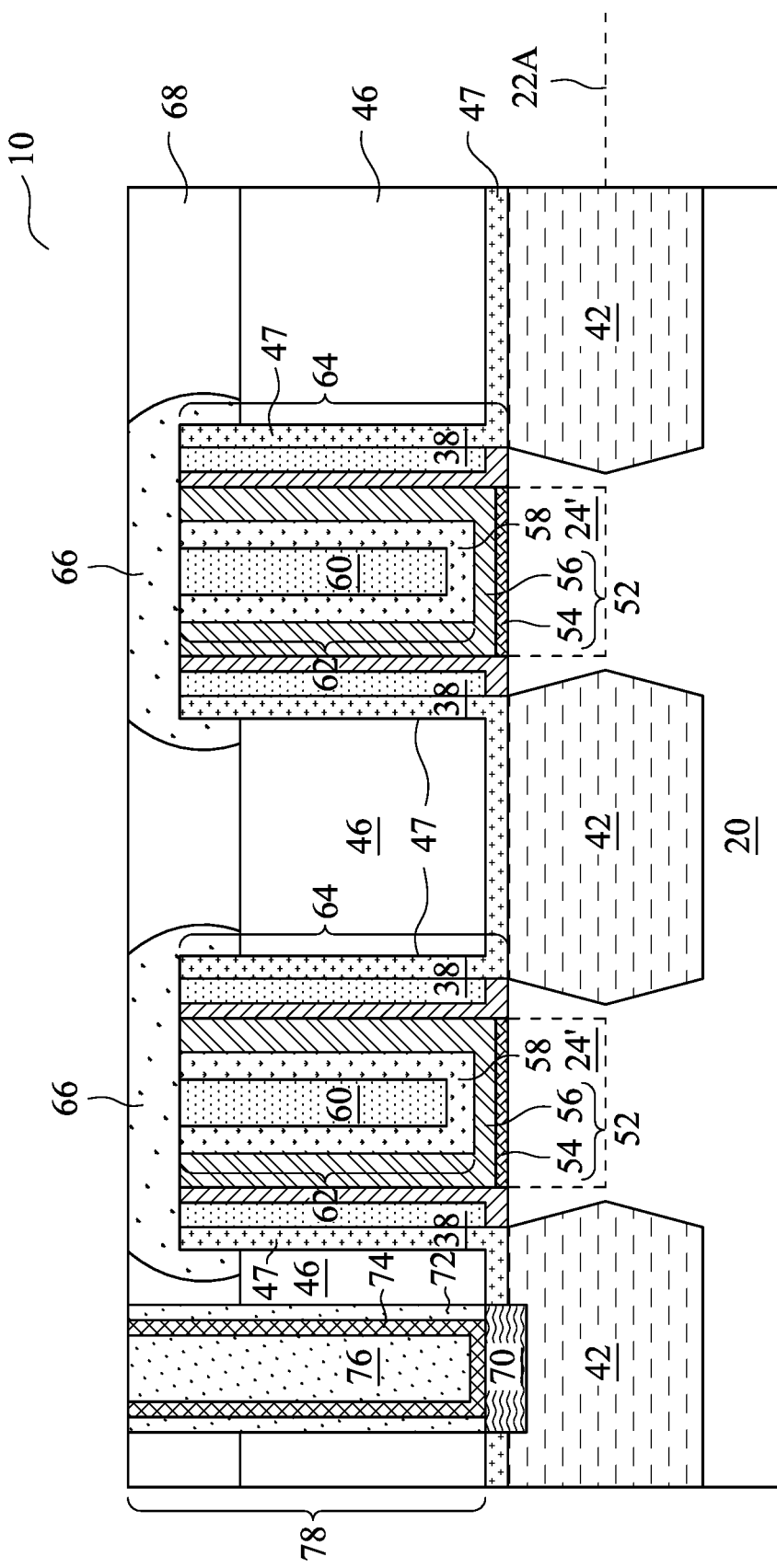
Figure 16:
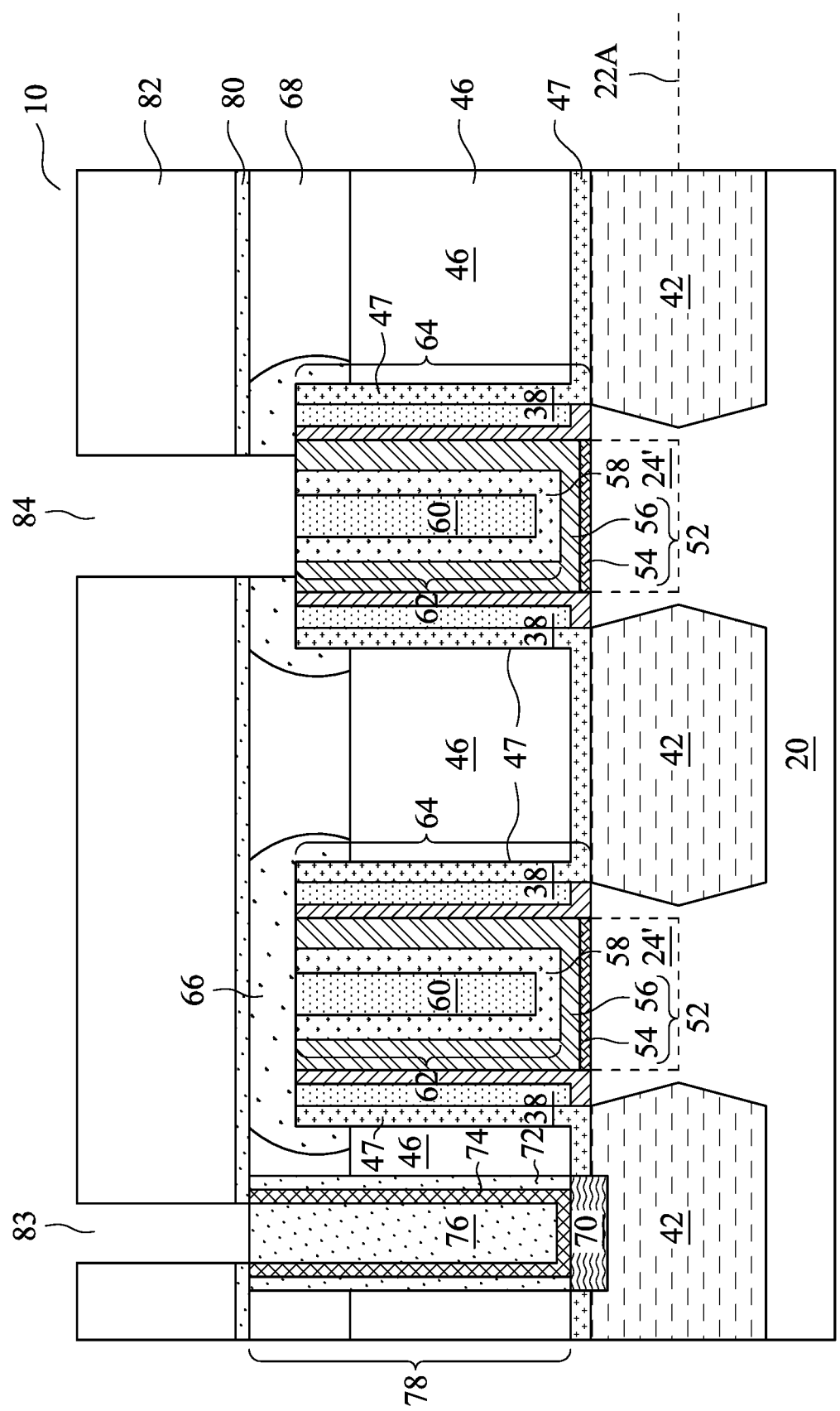
Figure 17:
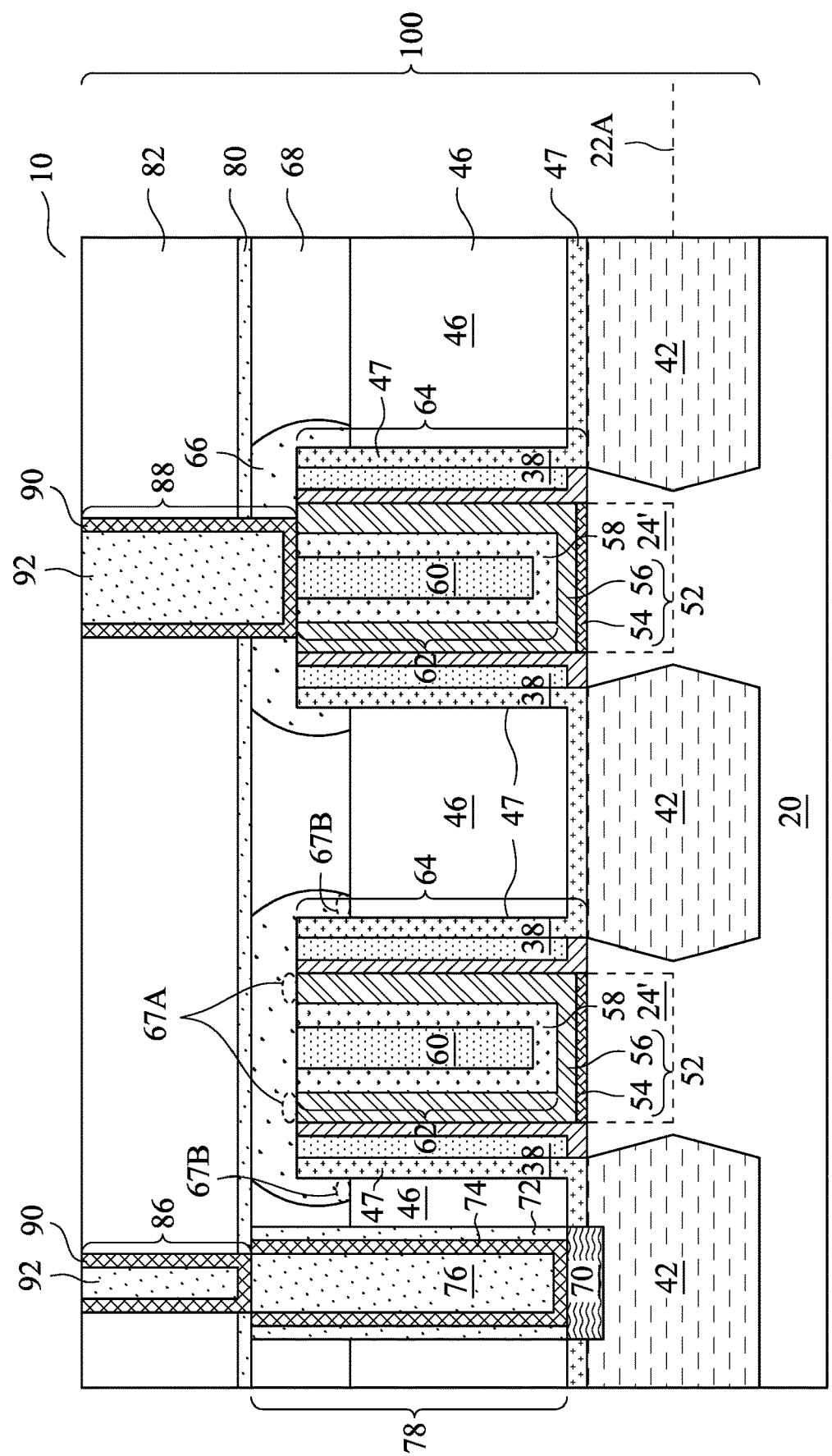
Figure 18:
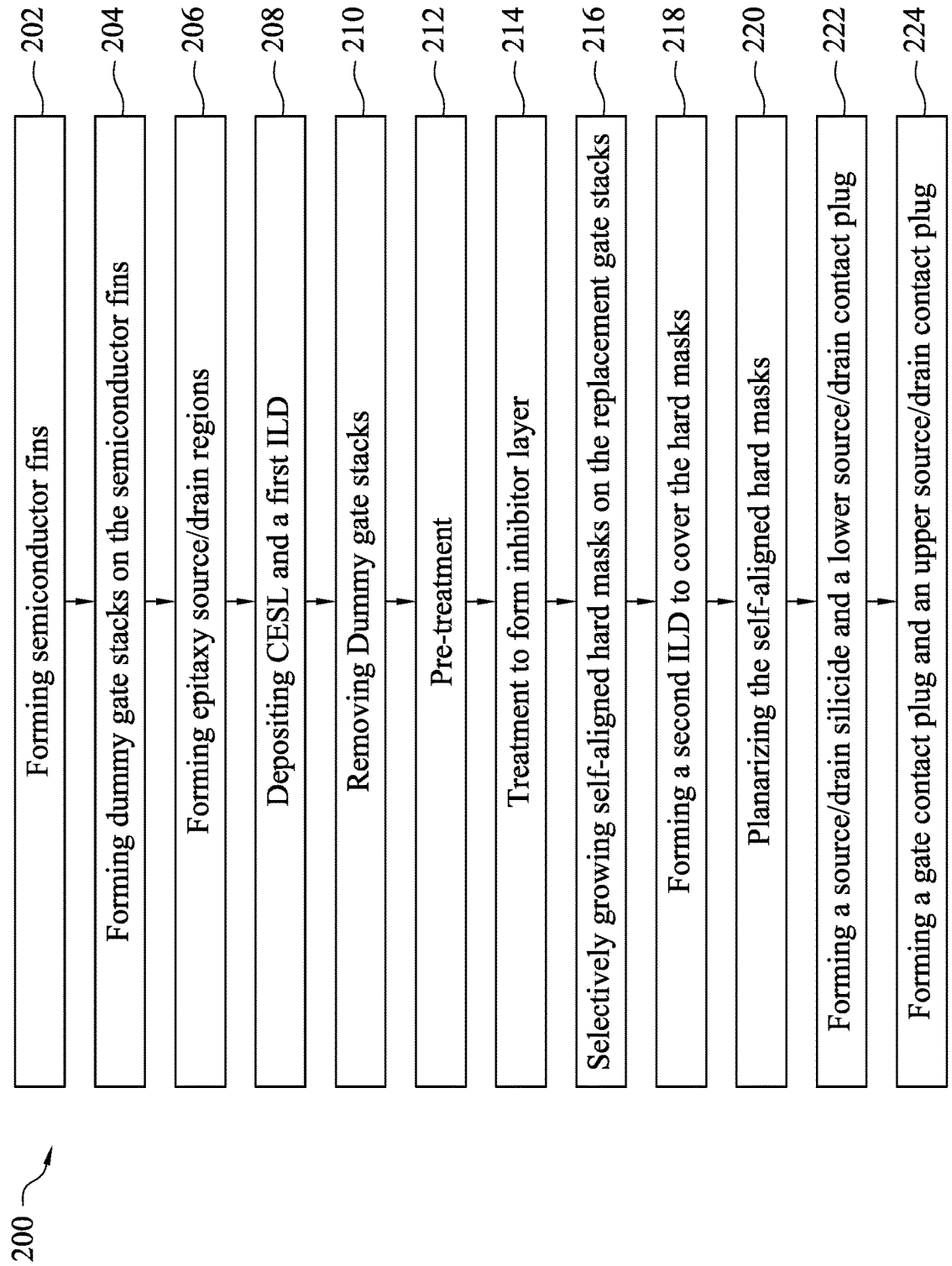
FIG. 18 illustrates a process flow for forming a transistor and contact plugs in accordance with some embodiments.

FIGS. 15 through 17 illustrate the formation of source/drain contact plugs and gate contact plugs. In the illustrative exemplary embodiments, three source/drain regions 42 are shown, and the illustrated process shows the formation of one source/drain contact plug connected to the leftmost source/drain region 42. In actual process, there are also source/drain contact plugs formed to connect to the center and rightmost source/drain regions 42. These source/drain contact plugs, however, are formed in different planes than illustrated, and hence are not shown in the illustrated plane. Similarly, although one gate contact plug is illustrated as formed directly over the replacement gate stack 64 on the right side of the figures, there may also be a gate contact plug formed directly over the left gate stack 64, which is in a different plane than illustrated, and hence is not shown.

FIG. 15 illustrates the formation of source/drain silicide region 70, metal layer 72, conductive barrier layer 74, and metal region 76. The respective step is illustrated as step 222 in the process flow 200 as shown in FIG. 18. In accordance with some embodiments, metal layer 72 (a titanium layer, for example) is deposited as a blanket layer, followed by a nitridation process on the top portion of metal layer 72 to form a metal nitride layer (74, for example). The bottom portion of metal layer 72 is not nitridated. Next, an anneal (which may be rapid thermal anneal) is performed to react the metal layer 72 with the top portion of source/drain regions 42 to form silicide region 70. The portions of metal layer 72 on the sidewalls of ILD 46 are not reacted. Next, either the previously formed metal nitride layer 74 is left as the illustrated conductive barrier 74, or the previously formed metal nitride layer 74 is removed, followed by the deposition of a new metal nitride layer (such as titanium nitride, also represented using reference numeral 74) that is thinner than the removed metal nitride layer. Metal region 76 is then formed, for example, by filling tungsten, cobalt, or the like, followed by a planarization to remove excess materials, resulting in lower source/drain contact plug 78.

Referring to FIG. 16, in accordance with some embodiments of the present disclosure, etch stop layer 80 is formed. In accordance with some embodiments, etch stop layer 80 is formed of SiN, SiCN, SiC, SiOCN, or another dielectric material. The thickness of etch stop layer 80 may be in the range between about 2 nm and about 4 nm. The formation method may include PECVD, ALD, CVD, or the like. Next, ILD 82 is formed over etch stop layer 80. The material of ILD 82 may be selected from the same candidate materials (and methods) for forming ILD 46 and ILD 68, and ILDs 46, 68, and 82 may be formed of the same or different dielectric materials. In accordance with some embodiments, ILD 82 is formed of using PECVD, FCVD, spin-on coating, or the like, and may include silicon oxide ($SiO_2$). The thickness of ILD 82 may be in the range between about 700 Å and about 800 Å.

ILD 82 and etch stop layer 80 are etched to form openings 83 and 84. The etching may be performed using, for example, Reactive Ion Etch (RIE). In a subsequent step, as shown in FIG. 17, plugs/vias 86 and 88 are formed. The respective step is illustrated as step 224 in the process flow 200 shown in FIG. 18. In accordance with some embodiments of the present disclosure, plugs/vias 86 and 88 include barrier layers 90 and metal-containing material 92 over the barrier layers. In accordance with some embodiments of the present disclosure, the formation of plugs/vias 86 and 88 includes forming a blanket barrier layer 90 and a metal-containing material 92 over the blanket barrier layer, and performing a planarization to remove excess portions of the blanket barrier layer and the metal-containing material. Barrier layer 90 may be formed of a metal nitride such as titanium nitride or tantalum nitride. Metal-containing material 92 may be formed of tungsten, cobalt, copper, or the like.

In the final FinFET 100, gate contact plug 88 penetrates through the respective hard mask 66, with the remaining hard mask 66 having portions on the opposite sides of gate contact plug 88. Hard masks 66 extend laterally beyond the respective replacement gates 64 and CESL 47, and have curved (which may be rounded) sidewalls in contact with ILD 68.

The embodiments of the present disclosure have some advantageous features. By forming the hard mask using selective deposition on the metal gates rather than recessing the metal gates and then forming the hard mask in the recesses, the metal gates do not need to count-in the height lost during the recessing, and can be formed not as high. The gap filling in the formation of the metal gates is thus easier. The pattern-loading effect in the recessing of metal gates, which causes the final metal gates to have different heights, is also eliminated.

In accordance with some embodiments of the present disclosure, a method includes forming a metal gate in a first inter-layer dielectric, performing a treatment on the metal gate and the first inter-layer dielectric, selectively growing a hard mask on the metal gate without growing the hard mask from the first inter-layer dielectric, depositing a second inter-layer dielectric over the hard mask and the first inter-layer dielectric, planarizing the second inter-layer dielectric and the hard mask, and forming a gate contact plug penetrating through the hard mask to electrically couple to the metal gate.

In accordance with some embodiments of the present disclosure, a method includes forming a metal gate in a first inter-layer dielectric, recessing the first inter-layer dielectric so that a top surface of the first inter-layer dielectric is lower than a top surface of the metal gate, and selectively growing a hard mask on the metal gate. The hard mask includes a top portion grown upwardly, and a sidewall portion grown horizontally. The method further includes depositing a second inter-layer dielectric over the hard mask and the first inter-layer dielectric, and planarizing the hard mask, with a bottom portion of the hard mask remaining to cover the metal gate. A gate contact plug is formed to penetrate through the second inter-layer dielectric to electrically couple to the metal gate.

In accordance with some embodiments of the present disclosure, a device includes a first inter-layer dielectric, a gate stack having a metal gate in the first inter-layer dielectric, and a hard mask including a first portion overlapping the gate stack, and a second portion overlapping a first portion of the first inter-layer dielectric. A second inter-layer dielectric has a sidewall contacting a sidewall of the hard mask. The second inter-layer dielectric overlaps a second portion of the first inter-layer dielectric. A gate contact plug penetrates through the hard mask to contact the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a gate stack;
a contact etch stop layer comprising a horizontal portion and a vertical portion;
a first inter-layer dielectric over and contacting the horizontal portion of the contact etch stop layer, wherein the gate stack has a portion in the first inter-layer dielectric;
a hard mask comprising a first portion overlapping and contacting the gate stack, and a second portion contacting a sidewall of the vertical portion of the contact etch stop layer; and
a gate contact plug penetrating through the hard mask to electrically couple to the gate stack.

2. The device of claim 1, wherein the first portion and the second portion of the hard mask are portions of a continuous region formed of a homogenous dielectric material, and the second portion of the hard mask is lower than a top surface of the gate stack.

3. The device of claim 1 further comprising:
a second inter-layer dielectric over and contacting the first inter-layer dielectric, wherein an entirety of the hard mask is in the second inter-layer dielectric.

4. The device of claim 3 further comprising:
an etch stop layer over and contacting the second inter-layer dielectric and the hard mask; and
a third inter-layer dielectric over and contacting the etch stop layer.

5. The device of claim 3, wherein the gate contact plug is separated from the second inter-layer dielectric by the hard mask.

6. The device of claim 3, wherein the first inter-layer dielectric and the second inter-layer dielectric form a planar interface, and the planar interface is lower than a top surface of the gate stack.

7. The device of claim 1, wherein the hard mask comprises a nitride-based dielectric material, and the first inter-layer dielectric comprises a silicon-oxide-based dielectric material.

8. The device of claim 1, wherein the hard mask comprises:
a planar top surface; and
curved sidewalls joined to the planar top surface.

9. The device of claim 1 further comprising gate spacers on opposing sides of the gate stack, wherein the hard mask physically contacts the gate spacers.

10. The device of claim 1, wherein the gate stack comprises a gate dielectric, and a void separates a top surface of the gate dielectric from the hard mask.

11. The device of claim 1, wherein a void separates a top surface of the first inter-layer dielectric from the hard mask.

12. The device of claim 1, wherein the hard mask contacts an upper portion of the sidewall of the vertical portion of the contact etch stop layer, and the first inter-layer dielectric contacts a lower portion of the sidewall of the vertical portion of the contact etch stop layer.

13. A device comprising:
   a semiconductor region;
   a first inter-layer dielectric over the semiconductor region;
   a gate stack in the first inter-layer dielectric;
   a dielectric region comprising:
      a first bottom surface contacting a first top surface of the gate stack; and
      a second bottom surface contacting a second top surface of the first inter-layer dielectric, wherein the second bottom surface is lower than the first bottom surface; and
   a second inter-layer dielectric over the first inter-layer dielectric, wherein the dielectric region is in the second inter-layer dielectric.

14. The device of claim 13, wherein the dielectric region comprises:
   a third top surface coplanar with a fourth top surface of the second inter-layer dielectric.

15. The device of claim 13 further comprising a contact etch stop layer comprising:
   a bottom portion underlying the first inter-layer dielectric; and
   a sidewall portion having a sidewall contacting both of the first inter-layer dielectric and the dielectric region.

16. The device of claim 13, wherein the first bottom surface and the second bottom surface of the dielectric region form a step along with a sidewall of the dielectric region.

17. A device comprising:
   a semiconductor fin;
   a gate stack on the semiconductor fin;
   a gate spacer on a sidewall of the gate stack;
   a contact etch stop layer comprising:
      a vertical portion on a first sidewall of the gate spacer, wherein the vertical portion comprises a second sidewall comprising a lower portion and an upper portion over the lower portion; and
      a horizontal portion connected to a bottom end of the vertical portion;
   a first inter-layer dielectric over and contacting the horizontal portion of the contact etch stop layer;
   a dielectric region contacting a top surface of the gate stack and the upper portion of the second sidewall; and
   a second inter-layer dielectric, wherein an entirety of the dielectric region is in the second inter-layer dielectric.

18. The device of claim 17, wherein the second inter-layer dielectric is separated from the gate stack and the gate spacer by the dielectric region.

19. The device of claim 17, wherein top surfaces of the second inter-layer dielectric and the dielectric region are coplanar.

20. The device of claim 17, wherein the dielectric region is formed of silicon nitride, and the first inter-layer dielectric is formed of a silicon-oxide-based dielectric material.

* * * * *